(12) United States Patent
Barstow et al.

(10) Patent No.: US 8,575,027 B1
(45) Date of Patent: Nov. 5, 2013

(54) SPUTTERING AND ALIGNING MULTIPLE LAYERS HAVING DIFFERENT BOUNDARIES

(75) Inventors: Sean Barstow, San Jose, CA (US); Owen Fong, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/533,810

(22) Filed: Jun. 26, 2012

(51) Int. Cl.
*H01L 21/44* (2006.01)
*H01L 21/31* (2006.01)
*H01L 21/469* (2006.01)

(52) U.S. Cl.
USPC ..... 438/679; 438/653; 438/761; 257/E21.584

(58) Field of Classification Search
USPC ............ 438/61, 653, 761, 679; 257/E21.584
See application file for complete search history.

(56) References Cited

U.S. PATENT DOCUMENTS

| | | |
|---|---|---|
| 6,911,129 B1 | 6/2005 | Li |
| 7,867,904 B2 | 1/2011 | Chiang et al. |
| 2005/0166850 A1 | 8/2005 | Li |
| 2007/0269611 A1 | 11/2007 | Xiang et al. |
| 2009/0061108 A1 | 3/2009 | Endo et al. |
| 2012/0228122 A1* | 9/2012 | Minami .................... 204/192.1 |
| 2013/0122630 A1* | 5/2013 | Black ............................ 438/61 |

FOREIGN PATENT DOCUMENTS

WO   WO-01-85364 A1   11/2001

* cited by examiner

*Primary Examiner* — David S Blum (57) ABSTRACT

Provided are methods and systems for forming discreet multilayered structures. Each structure may be deposited by in situ deposition of multiple layers at one of multiple site isolation regions provided on the same substrate for use in combinatorial processing. Alignment of different layers within each structure is provided by using two or more differently sized openings in-between one or more sputtering targets and substrate. Specifically, deposition of a first layer is performed through the first opening that defines a first deposition area. A shutter having a second smaller opening is then positioned in-between the one or more targets and substrate. Sputtering of a second layer is then performed through this second opening that defines a second deposition area. This second deposition area may be located within the first deposition area based on sizing and alignment of the openings as well as alignment of the substrate.

19 Claims, 8 Drawing Sheets

SPUTTERING AND ALIGNING MULTIPLE LAYERS HAVING DIFFERENT BOUNDARIES

TECHNICAL FIELD

This document relates generally to sputtering multiple layers of different materials in the same processing chamber and, more specifically, to sputtering and aligning multiple layers having different deposition areas.

BACKGROUND

Physical vapor deposition (PVD) is commonly used for semiconductor processing as well as within for processing solar materials, glass coatings, and the like. PVD is typically used to deposit a thin layer of a certain material onto a substrate. Sputtering is a common type of PVD, in which atoms or molecules are ejected from a target material (arranged into a sputtering target) by high-energy particle bombardment and then deposited onto the substrate.

Fabrication of integrated circuits (IC), semiconductor devices, flat panel displays, optoelectronics devices, data storage devices, magneto-electronic devices, magneto-optic devices, packaged devices, and the like entails integration and sequencing various different operations. As an example, IC fabrication typically includes a series of processing steps, such as cleaning, surface preparation, deposition, lithography, patterning, etching, planarization, implantation, thermal annealing, and other related operations. The precise sequencing and integration of these operations allow formation of functional devices that meet desired performance metrics, such as speed, power consumption, and reliability.

Discovery, optimization, and qualification of each unit process may involve testing different materials, different processing conditions used in a process module, different sequencing and integration of processing modules within an integrated processing tool, different sequencing of processing tools in executing different process sequence integration flows, and various combinations thereof. Specifically, multiple different materials, processing conditions, sequences of operations, integration flows, and other factors (collectively referred herein as "combinatorial process sequence integration") may need to be tested on as fewer substrates as possible. The combinatorial process sequence integration approach can greatly improve the speed and reduce the cost associated with the discovery, implementation, optimization, and qualification of new materials, processes, and integration sequences.

SUMMARY OF THE DISCLOSURE

Provided are methods and systems for forming discreet multilayered structures. Each structure may be deposited by in situ sputtering of multiple layers at one of multiple different site isolation regions provided on the same substrate for use in combinatorial processing. Alignment of different layers within each structure is provided by using two differently sized openings in-between one or more sputtering targets and substrate. Specifically, sputtering a first layer is performed through the first opening that defines a deposition area of that layer. A shutter having a second smaller opening is then positioned in-between the one or more targets and substrate. Sputtering of a second layer is then performed through this second opening that defines a deposition area of that layer. This second deposition area may be located within the first deposition area based on sizing and alignment of the openings as well as alignment of the substrate. However, deposition through the smaller opening does not necessarily have to be performed after deposition through a larger opening. In some embodiments, deposition through the smaller opening is performed before deposition through a larger opening. For example, during barrier material screening further described below, a material could be sputtered through a smaller opening directly on a blanket barrier (or other) material, followed by deposition of another (e.g., cap) material through a larger opening.

Provided is a method of forming a multilayered structure at a site isolation region of a semiconductor substrate. In certain embodiments, the method involves aligning the site isolation region on the semiconductor substrate relative to a first opening of a processing apparatus. This alignment may be provided by moving the substrate relative to a component of the processing apparatus, such as a shield, that defines the first opening. The processing apparatus may include a system controller for controlling various operations described herein.

The method may proceed with sputtering a first layer onto the semiconductor substrate through the first opening. The first opening defines a deposition area of the first layer, for example, by restricting a portion of the sputtered flux and allowing the remaining portion of the flux through the opening and towards the substrate. The first layer may be deposited on the top surface of the substrate or another layer previously deposited on the substrate.

The method may proceed with adjusting the position of the shutter that includes the second opening. The second opening is smaller than the first opening. In some embodiments, the second opening is positioned within the boundary of the first opening based on the projection direction that is normal to the top surface of the substrate. The method may then proceed with sputtering a second layer onto the semiconductor substrate through the second opening. The second opening defines a deposition area of the second material, e.g., by restricting a portion of the sputtered flux and allowing the remaining portion of the flux through the second opening and towards the substrate. The first opening may also be positioned in the path of this flux but may or may not block any portion of this flux. The deposition area of the second material may be within the deposition area of the first material at the site isolation region of the semiconductor substrate. This alignment of the two deposition areas may be provided based on alignment of the two openings relative to the site isolation region and, in some embodiments, with respect to each other.

In some embodiments, the first opening is between about 1.2 and 5 times larger than the second opening. Sizes of the two openings may be compared based on their areas or cross-sectional dimensions further defined below. In some embodiments, the first and second openings have the same shape. For example, both openings may have circular shapes. The first opening and second opening may be concentric when the second opening is positioned within the boundary of the first opening during the shutter adjustment operation. At other times, the first opening may be positioned away from the second opening. For example, the shutter may be kept clear from the first opening when the shutter is in its open position. The first opening may be sized in such a way that multiple discrete multilayered structures may be formed on the same substrate. In some embodiments, the cross-sectional dimension of the first opening is between about 2 and 10 times less than the cross-section dimension of the substrate. In some embodiments, the first layer includes a diffusion barrier layer, while the second layer includes a copper seed layer. The diffusion barrier layer may include one or more of tantalum and titanium. Other metals and various compounds of metals, such as metal nitrides (e.g., tantalum nitride and titanium nitrides) can be used. The substrate may include one or more of silicon and silicon oxide. In a specific example of barrier material screening, the substrate is a silicon wafer including some type of dielectric material, such as Si—C—O—H or Si—C—O—N.

The method may also involve adjusting the position of the shutter such that the shutter is clear of the first opening. While maintaining this orientation of the shutter, the method may proceed with sputtering a third layer onto the semiconductor substrate through the first opening. The first opening defines a deposition area of the third layer. If the substrate is not moved relative to the first opening between deposition of the first layer and third layer or if the substrate is returned at substantially the same position, then the first layer may be substantially aligned with the third layer. The third layer may be or may include a capping layer. The capping layer may contain one or more of tantalum and titanium or other materials.

In some embodiments, sputtering the first and second layers is performed in situ. In some embodiments, the substrate is not removed from the deposition chamber between sputtering the first and second layers. In some embodiments, some process conditions, such as substrate temperature and/or chamber pressure, are maintained substantially the same between sputtering the first and second layers.

In some embodiments, sputtering at least one of the first and second layers is performed using a sputtering gun that is tilted at an angle with respect to an axis normal to the semiconductor substrate. More specifically, sputtering flux generated by the sputtering gun may be directed at an angle other than normal relative to the top surface of the semiconductor substrate. In some embodiments, the angle of a sputtering gun relative to the normal of the substrate is between about 5 degrees and 20 degrees. Such orientation of sputtering guns allows directing fluxes from multiple sputtering guns towards the same set of openings without a need to move components of the processing apparatus. Multiple sputtering guns may be used for co-sputtering when multiple fluxes from different sputtering guns are directed towards the same opening. Alternatively or in addition to co-sputtering, multiple sputtering guns may be used in sequences for producing a multilayered structure. Deposition of the first layer may be performed using a first sputtering gun, while deposition of the second layer may be performed using a second sputtering target.

In some embodiments, the semiconductor substrate is movable with respect to the first opening in a direction parallel to a top surface of the semiconductor substrate. This feature may be used for aligning the site isolation region on the semiconductor substrate relative to the first opening of the processing apparatus and/or for moving from one site isolation region to another site isolation region. Deposition of two or more layers at the same site isolation region may be performed without moving the substrate relative to the first opening or relative to other stationary components of the apparatus. In some embodiments, a substrate may be moved after depositing a layer at a first site isolation region. This movement may be performed to align the first opening with a second site isolation region and depositing another layer at that second site isolation region. At some point the substrate may be moved such that the first opening is again aligned with the first site isolation region and an additional layer may be deposited at this region. In some embodiments, the method involves aligning a second site isolation region on the semiconductor substrate with the first opening of the processing apparatus and repeating the deposition of the first layer, adjusting the position of the shutter, and depositing the second layer.

Provided also are methods of forming a multilayered structure at a site isolation region of a semiconductor substrate involving aligning a first site isolation region on the semiconductor substrate with a first opening of a processing apparatus. The methods then proceeds with depositing a first layer onto the semiconductor substrate through the first opening defining a deposition area of the first layer and adjusting the position of a shutter having a second opening. The second opening may be smaller than the first opening and may be positioned within a boundary of the first opening. The methods continue with depositing a second layer onto the semiconductor substrate through the second opening defining a deposition area of the second material such that the deposition area of the second material is within the deposition area of the first material at the site isolation region of the semiconductor substrate. Furthermore, the second layer may have a different composition than the first layer. The methods may proceed with adjusting the position of the shutter such that the shutter is clear from the boundary of the first opening and depositing a third layer onto the semiconductor substrate through the first opening defining a deposition area of the third layer such that the deposition area of the third area is substantially aligned with the deposition area of the second area. In some embodiments, the second layer is positioned in between the first layer and the second layer.

Provided also is a processing apparatus for forming a multilayered structure at a site isolation region of a semiconductor substrate. The processing apparatus may include a first opening provided within the processing apparatus, a substrate holder for receiving the semiconductor substrate, one or more sputtering guns for depositing one of more layers onto the semiconductor substrates, and a shutter having a second opening smaller than the first opening. The substrate holder may be movable with respect to the first opening to align different site isolation regions on the semiconductor substrate with the first opening. The first opening may be provided between the one or more sputtering guns and the substrate holder. The shutter may be movable with respect to the first opening between an open position, in which the shutter is clear from the first opening, and closed position, in which the second opening is positioned within a boundary of the first opening.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

Integrated circuit (IC) fabrication methods generally involve deposition of conductive metals into recessed features and other surfaces provided on an inter-layer dielectric (ILD). These metals provide conductive paths, which extend horizontally and vertically within the ILD, connecting various devices (e.g., transistors) in a desired pattern. The metal lines formed in adjacent ILD layers are connected to each other by a series of interconnections. A substrate may include one or more such layers with vertical and horizontal features that are subsequently filled with conductive metals. The resulting layer containing metal-filled lines residing in a dielectric is referred to as a metallization layer. Copper is a commonly used for filling modern devices due to its low resistivity and high electromigration resistance. Aluminum and tungsten are other frequently used metallization materials.

Some conductive metals, for example copper, can diffuse into surrounding dielectric materials that form trenches and vias. Contamination of ILD with conductive materials can negatively impact the dielectric properties of the ILD. Maintaining low dielectric constants (low-k) is particularly important in ICs having densely packed features, where ILD structures are small. Contamination can cause signal delay (RC time constant) and crosstalk between conducting lines, thus adversely affecting the performance of devices. A diffusion barrier layer may used between ILD and metals to prevent these metals from diffusing into the ILD. The diffusion barrier is a continuous layer and is usually sufficiently thick and made of materials that prevent migration of the metals. Many barrier layer materials are poor electronic conductors in comparison, for example, to copper and aluminum and also are inert to initiating uniform and adherent electroplating thereupon. Hence, these barrier materials typically require an additional conductive seed layer formed over the barrier layer to initiate and promote feature filling and electroplating of the conductive metal. However, each such layer adds to production costs and complexities.

Further miniaturization of IC devices results in constantly decreasing dimensions of device features. Conductive line widths are reaching levels of 50 nm lines and even less. Electroplating copper or other material into such small features can present a set of challenges. Specifically, the diffusion barrier layer must be scaled down together with the line's dimensions. Thinner barrier layers provide more space available for conductive materials in order to maintain adequate conductivity. Yet, these thinner barrier layers still have to provide sufficient diffusion blocking properties. Furthermore, certain barrier and seed layer materials may drive specific structural requirements. For example, copper seed layers generally need to have a certain minimum thickness in order to maintain their continuity when deposited over tantalum based barrier layers. As, reducing thicknesses of these layers may be challenging and require extensive experimentation.

New barrier materials with improved characteristics are being actively sought by the semiconductor industry, but this process is not easy. For example, new barrier materials need to have a sufficient conductivity, good step coverage for high aspect ratio features, good copper wetting, and adequate adhesion and barrier properties, while being formed into relative thin layers. High Productivity Combinatorial (HPC) approaches are well suited for exploring a wide process and material space in order to evaluate various new barrier materials.

Physical vapor deposition (PVD) techniques or, more specifically, sputtering are commonly used in production for depositing barrier layers. These techniques may also be effectively used for combinatorial testing. Other deposition techniques, such as atomic layer deposition (ALD) and chemical vapor deposition (CVD), may be used as well. However, it has been reported that some barrier material candidates, such as tantalum nitrides, may have excessive resistivity and poor uniformity when deposited using ALD techniques. Furthermore, controlling thickness and other parameters may difficult when CVD techniques are used.

Figure 1A:
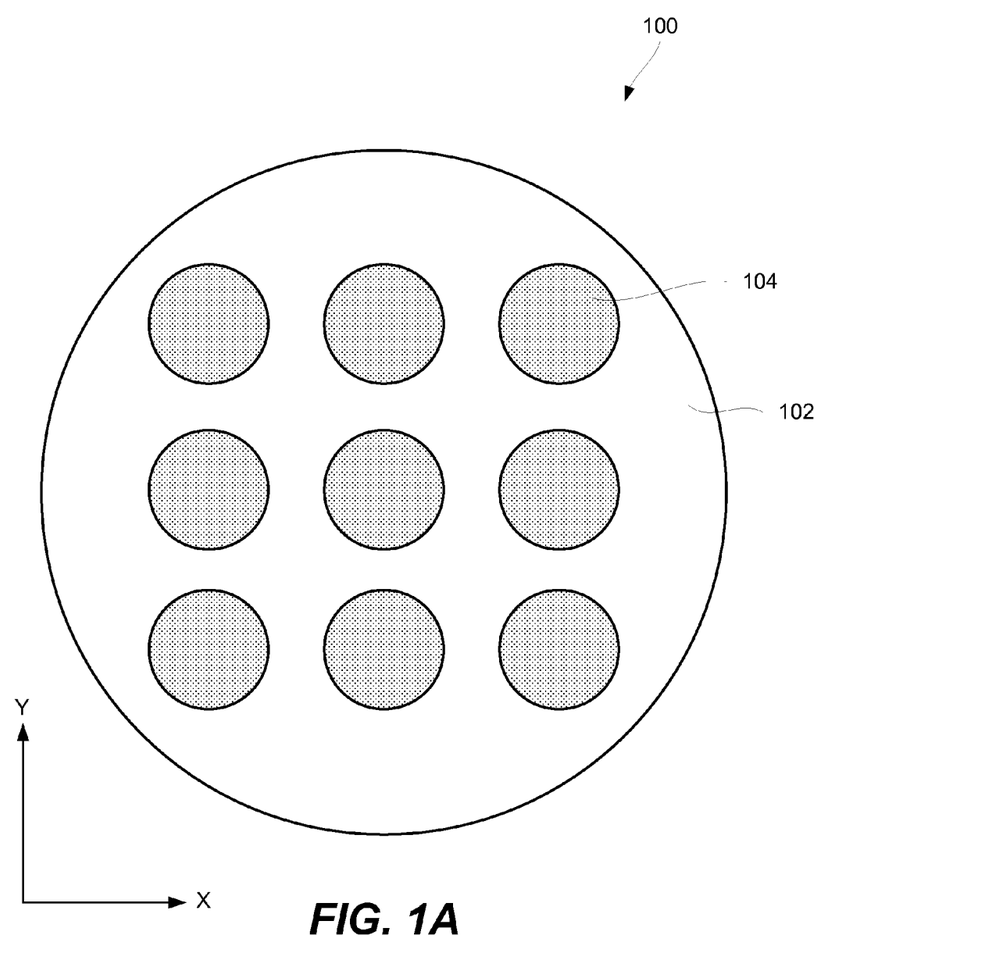
FIG. 1A illustrates a top schematic view of a semiconductor substrate having nine site isolation regions, in accordance with some embodiments.

FIG. 1A illustrates a top schematic view of a test sample 100 used in HPC testing, in accordance with certain embodiments. Test sample 100 may include multiple site isolation regions 104 provided on the same substrate 102. The number of site isolation regions 104 generally depends on the size of each region 104 and size of substrate 102. For example, a 300 millimeter wafer used as substrate 102 may have nine site isolation regions 104 that are about 60 millimeters in diameter each (as, e.g., shown in FIG. 1A.) In general, any number of site isolation regions can be provided on the same substrate, e.g., two, three, four, five, and so on. Multiple site isolation regions allow significant increase in testing throughput and forming multiple samples in the same processing environment (to provide better control). For example, multiple site isolation regions may be formed in situ without removing the substrate from a processing chamber.

Various types of substrates may be used for HPC testing. Some examples of substrates include wafers, such as a 1-inch wafer, 2-inch wafer, 3-inch wafer, 4-inch wafer, 5-inch wafer, 150 mm wafer, 200 mm wafer, 300 mm wafer, and 450 mm wafer. Substrates may be made from silicon, silicon dioxide, aluminum oxide, sapphire, germanium, gallium arsenide, various alloys of silicon and germanium, indium phosphide, and other materials. Other types of substrates include metallic substrates and polymer substrates used in photovoltaic, light emitting diodes, glass, and other applications. Some substrate materials may be crystalline.

Different site isolation regions provided on the same substrate may include the same type of materials and structures. Such structures may be used to generate multiple samples, for example, to perform different tests or repeating the same test. In situ deposition ensures uniformity among different structures. Alternatively, different materials and/or structures may be used for different site isolation regions. For example, barrier layers having different thicknesses may be deposited on the same substrate. In the same or another example, barrier layers deposited on the same substrate may have different compositions and/or morphological structure. Similar differentiation may be applied to other layers of multilayered stacks provide in each site isolation region. Overall, various multiple combinations of materials and process parameters may be tested on the same wafer using HPC PVD testing. Additional aspects of HPC testing are further described below with reference to FIGS. 2A and 2B. It should be noted that such testing granularity is not available when conventional blanket film deposition techniques are used.

Performing HPC testing on back end of line (BEOL) materials, such as barrier, seed, and, capping layers, may impose certain requirements on alignment of these layers in each site isolation region. For example, the seed layer of a multilayered stack may easily oxidize and, therefore, may need to be adequately protected from the environment after the multilayered stack is formed and the sample is removed from the processing environment. The entire seed layer needs to be protected because of its relatively small deposition area and potential influence on testing by oxidation of even edge portions. Furthermore, any direct contact between the seed layer and substrate may be undesirable because of potential contamination of the substrate. Again, even some contamination around edges of the sample may be sufficient to negatively influence some tests performed on the sample. Alignment of layers in multilayered stacks used for HPC testing is further explained below with reference to FIGS. 1B and 1C.

Figure 1B:
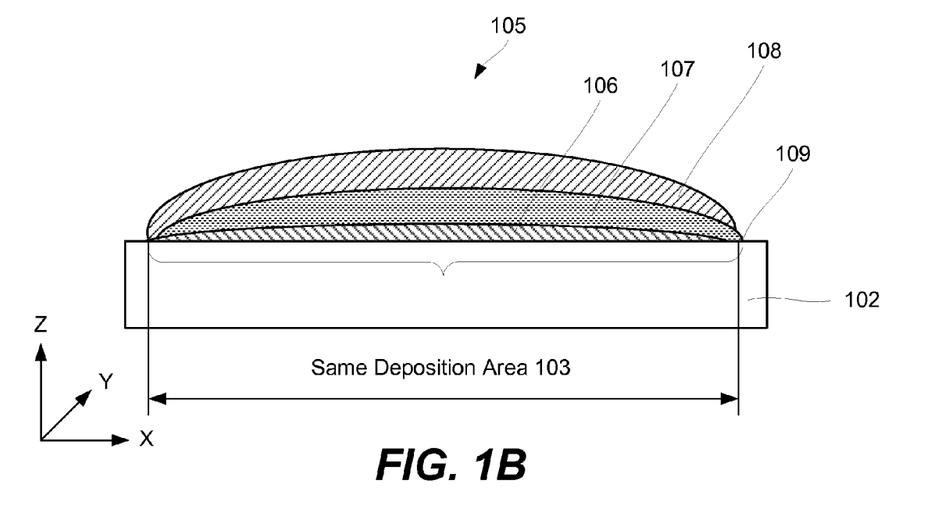
FIGS. 1B and 1C illustrate cross-sectional schematic views of different test samples, each having multiple layers, in accordance with some embodiments.
Figure 1C:
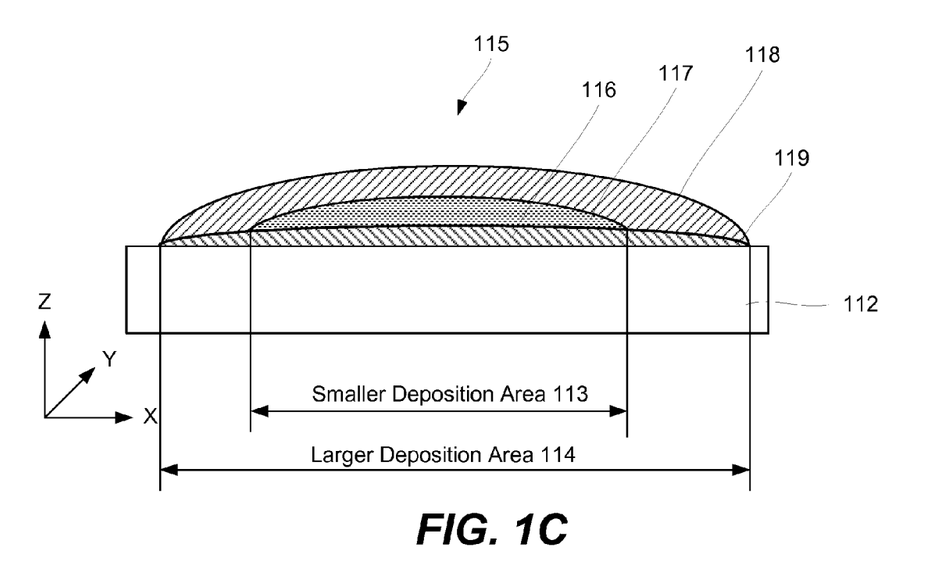

, FIGS. 1B and 1C illustrate schematic cross-sectional views of two test sample portions 105 and 115, in accordance with some embodiments. Each of test sample portions 105 and 115 include three layers formed on a corresponding substrate. Test sample portion 105 includes bottom layer 106, intermediate layer 107, and top layer 108, all of which have substantially the same deposition area 103. Such layers 106, 107, and 108 may be deposited by repeating sputtering at the same site isolation region of substrate 102 without changing an opening used for controlling deposition areas of the three layers. Furthermore, alignment of this opening with respect to substrate 102 may not have been changed or may have been repeated.

When the same deposition areas and same position of these deposition areas are used for two or more layers, it is possible that one of the lower layers is still exposed to the environment and/or one of the top layers still contacts the substrate. As shown in FIG. 1B, intermediate layer 107 is both exposed and touches substrate 102 around edges 109 of test sample portion 105. In some embodiments, test sample portion 105 may not be acceptable for testing if intermediate layer 107 is exposed and/or touches the substrate. For example, if intermediate layer 107 includes a seed material, such as copper, this seed material may oxidize (when sample 105 is removed from the processing chamber for testing) and/or diffuse into substrate 102. As discussed above, deposition area 103 is relatively small, while tests are quite sensitive. This oxidation and/or substrate contamination may negatively influence these tests.

As such, a stack in which one or more intermediates layers are isolated from the environment and substrate by top and bottom layers may be needed for certain tests, such as barrier layer tests, seed layer tests, capping layer tests, and the like. An example of such a stack is schematically shown in FIG. 1C. Specifically, test sample portion 115 shown in this figure includes bottom layer 116, intermediate layer 117, and top layer 118. However, intermediate layer 117 has a smaller deposition area 113, while bottom layer 116 and top layer 118 have larger deposition areas 114. Test sample portion 115 may be formed by depositing bottom layer 116 and top layer 118 using a larger opening inbetween, for example, sputtering targets and substrate 112 and using a smaller opening for depositing intermediate layer 117, as further described below with reference to FIGS. 5A, 5B, and 6. If sufficient alignment is maintained between the openings and the substrate, then intermediate layer 117 may not extend past larger deposition area 114 or, more specifically, outside the deposition area of bottom layer 116 and top layer 118. Layers of test sample portion 115 are arranged in such a way that intermediate layer 117 does not directly contact substrate 112 or is exposed to the environment thereby avoiding oxidation and substrate contamination and allowing greater test sensitivity. Edges 119 are formed by bottom layer 116 or top layer 118 and do not include any portion of intermediate layer 117.

Test sample portion 115 illustrated in FIG. 1C may be more suitable for certain tests than test sample portion 105 due to less influence of layer 117 on substrate 112 and being less influenced by the environment. Oxidation of intermediate layer 117 may be predominantly a function of top layer 118, which allows more precise characterization of top layer 118 in comparison to test sample portion 105 having partially exposed intermediate layer 107. Furthermore, substrate 102 is not contaminated by intermediate layer 117 since there is not direct contact. Instead, presence of intermediate layer materials in substrate 102 may be predominantly a function of bottom layer 116, which allows more precise characterization of bottom layer 116, again, in comparison with test sample portion 105 that allows a direct contact between substrate 102 and its intermediate layer 107. Even though test sample portion 115 may be more suitable, forming discrete multilayered stacks having particularly sized and aligned layers may be difficult if not impossible when conventional sputtering equipment and techniques are used.

Combinatorial Processing

Figure 2A:
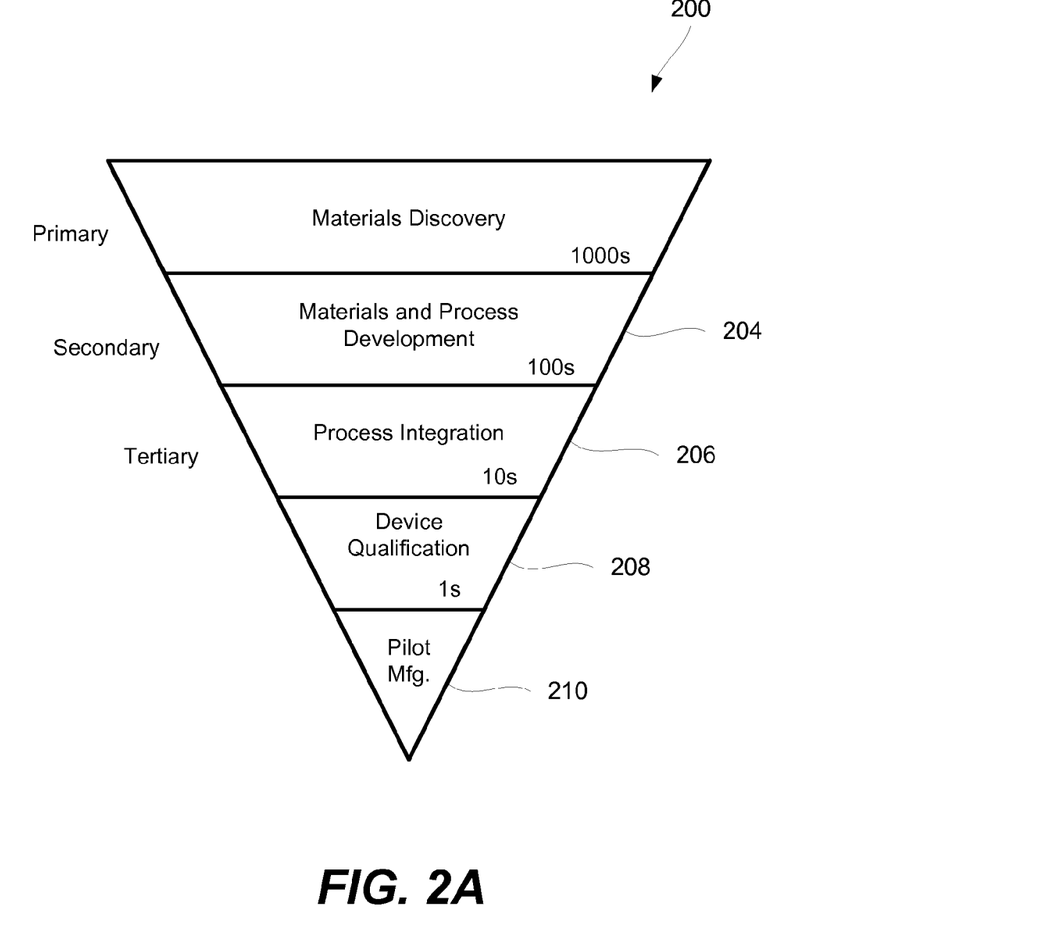
FIG. 2A illustrates a schematic diagram of combinatorial processing and evaluation using primary, secondary, and tertiary screening, in accordance with some embodiments.

Before describing various methods and systems of forming multilayered structures at multiple different site isolation regions on semiconductor substrates and ensuring specific alignment between adjacent layers in these structures, a brief description of HPC processing, in general, and HPC PVD processing, in particular, will be provided. FIG. 2A illustrates a schematic diagram 200 for implementing combinatorial processing and evaluation using primary, secondary, and tertiary screening, in accordance with certain embodiments. Schematic diagram 200 informs that relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during materials discovery stage 202, which is also known as a primary screening stage and is performed using primary screening techniques. Primary screening techniques may include dividing substrates into coupons or site isolation regions and depositing same or different materials using varied processes described elsewhere in this document. The materials are then evaluated, and promising candidates are advanced to the secondary screen stage or materials and process development stage 204. Evaluation of the materials produced at each stage may be performed using metrology tools, such as electronic testers and imaging tools.

Materials and process development stage 204 may be used to evaluate hundreds of materials (i.e., a magnitude smaller than the primary stage) and may focus on the processes used to deposit or develop those materials. HPC techniques allow processing many of these materials in parallel on the same substrate substantially reducing efforts and increasing testing throughputs. Furthermore, multilayered structures may be formed in situ without cumbersome transfer of substrate between multiple different processing apparatuses. Promising materials and processes are again selected and advanced to a tertiary screen stage or process integration stage 206 where tens of materials and/or processes and combinations are evaluated. This tertiary screen stage may focus on integrating the selected processes and materials with other processes and materials. Again, HPC techniques provide significant advances over conventionally used process at this and other stages of the overall process.

The most promising materials and processes from the tertiary screen are advanced to device qualification 208. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 210.

Schematic diagram 200 is just one example of various techniques that may be used to evaluate and select materials and processes for the development of new materials and processes. The above description of primary, secondary and other screening levels are arbitrary. Processes involve in each stage may overlap, occur out of sequence, be described and be performed in many other ways.

Some aspects of HPC techniques are further described in U.S. patent application Ser. No. 11/674,137 filed on Feb. 12, 2007, which is hereby incorporated by reference in its entirety for purposes of describing HPC techniques. Application of combinatorial techniques allows various testing integration in order to arrive at a globally optimal sequence of semiconductor devices, thin film photovoltaic (TFPV) modules, optoelectronic devices, and the like. Furthermore, these techniques allow development of manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor devices, TFPV modules, optoelectronic devices, and other like devices. A global optimum sequence order is, therefore, derived and as part of implementation of these techniques.

Figure 2B:
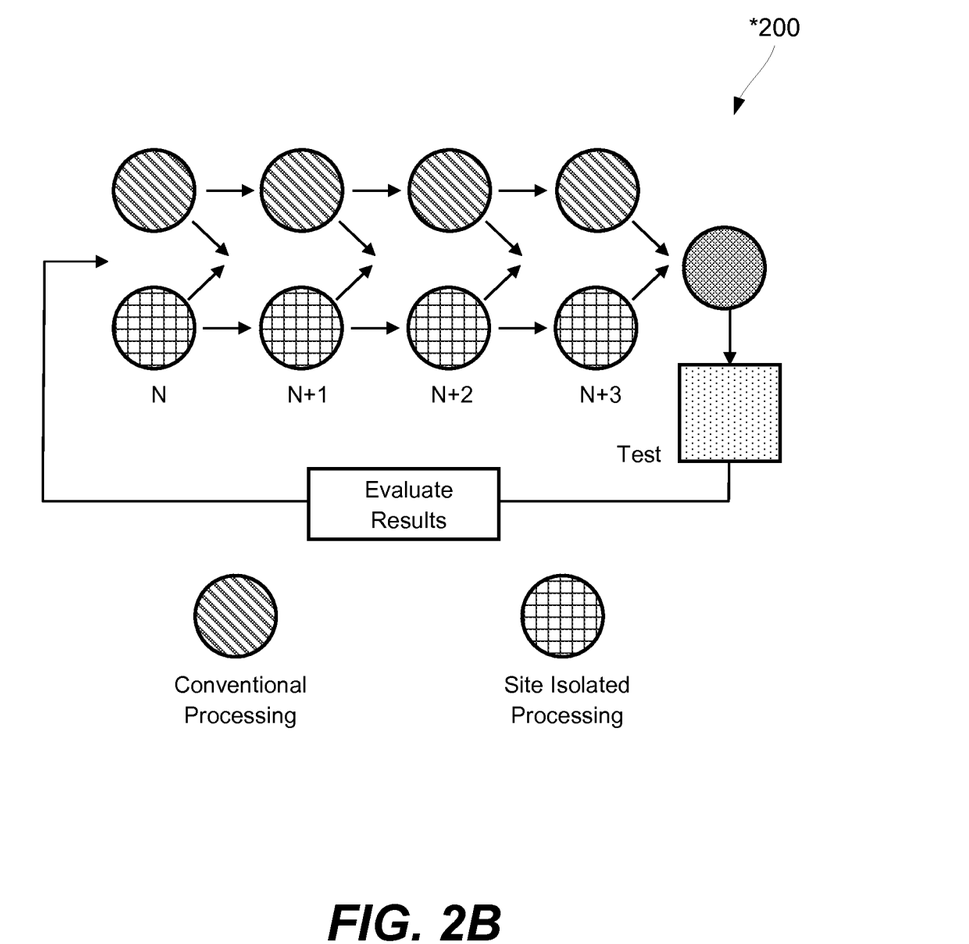
FIG. 2B illustrates a schematic diagram representing a general methodology for combinatorial process sequence integration involving site isolated processing and/or conventional processing, in accordance with some embodiments.

FIG. 2B is a simplified schematic diagram illustrating a general methodology for combinatorial process sequence integration that includes site isolated processing and/or conventional processing in accordance with one embodiment. In some embodiments, the substrate is initially processed using conventional process N. The substrate may be then processed using site isolated process N+1. During site isolated processing, an HPC systems may be used, some examples of which are further described below. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor device, TFPV module, optoelectronic device, etc. manufacturing may be varied.

HPC Systems

Figure 3:
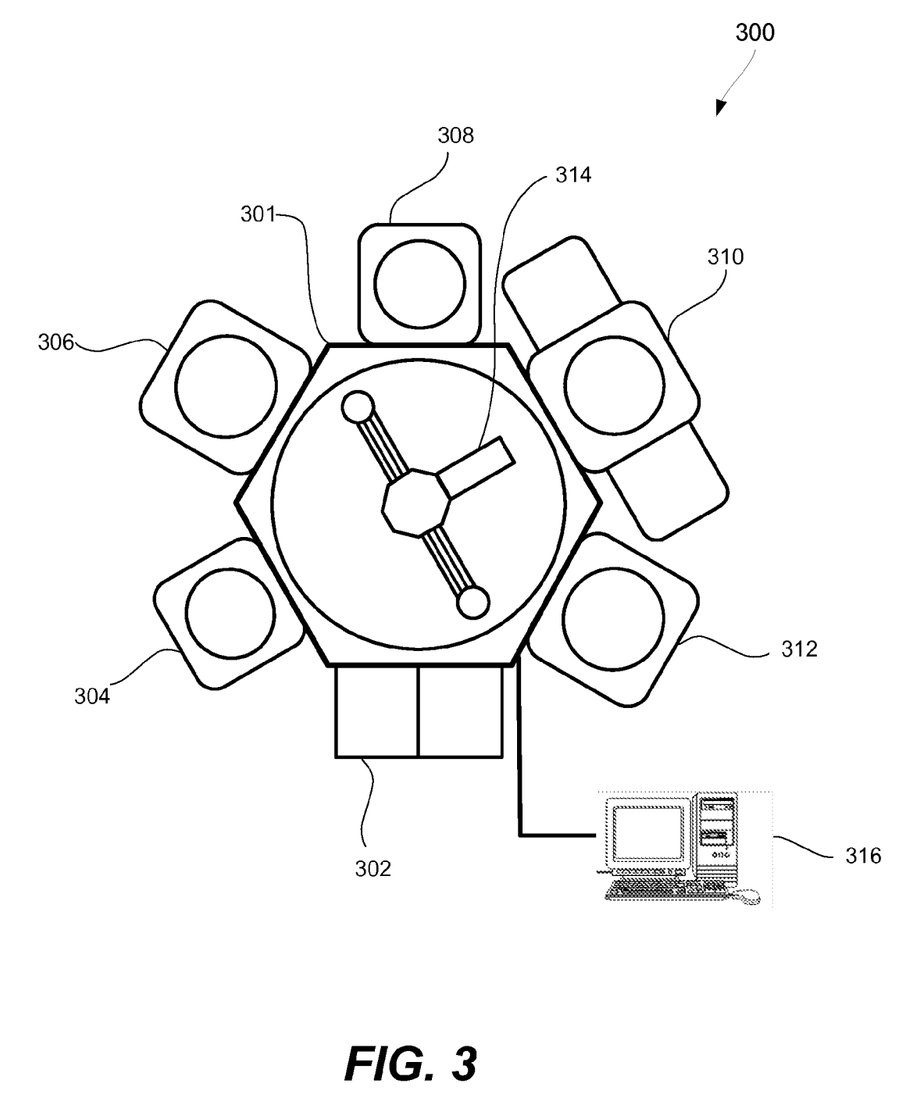
FIG. 3 illustrates a schematic diagram of an integrated high productivity combinatorial (HPC) system, in accordance with some embodiments.

FIG. 3 illustrates a schematic representation an integrated HPC system 300, in accordance with some embodiments. HPC system 300 includes a frame 301 supporting multiple processing modules. Frame 301 may be a unitary frame. In some embodiments, the environment within frame 301 is controlled and separated from the ambient. Load lock 302 provides an interface between the outside and inside environments of HPC system 300, allows passage of substrates, and provides access to its modules. Robot 314 may be provided within frame 301 for moving substrates between different modules and/or load lock 302. Modules 304-312 may be any set of modules and preferably include one or more combinatorial modules, examples of which are further described below with reference to FIG. 4. For example, module 304 may be a substrate alignment and degassing module, while module 306 may be a clean module, such as plasma-based or non-plasma based cleaning module. Modules 308 and/or 310 may be combinatorial or conventional dual purpose modules. Module 312 may provide conventional clean or degas as necessary for the experiment design.

Any types of chamber or combination of chambers may be implemented. The example illustrated in FIG. 3 and the description provided herein are merely illustrative and not meant to limit the potential chamber or processes that can be supported to combine combinatorial processing or combinatorial plus conventional processing of a substrate or wafer. In some embodiments, a system controller 316 is used to control various operations of HPC system 300, including alignment of substrates and opening, positions of shutters, power levels applied to sputtering guns, pressure levels used inside processing chambers, synchronization of duty cycles, and other features further presented and described below in more detail.

HPC PVD Apparatus

Figure 4:
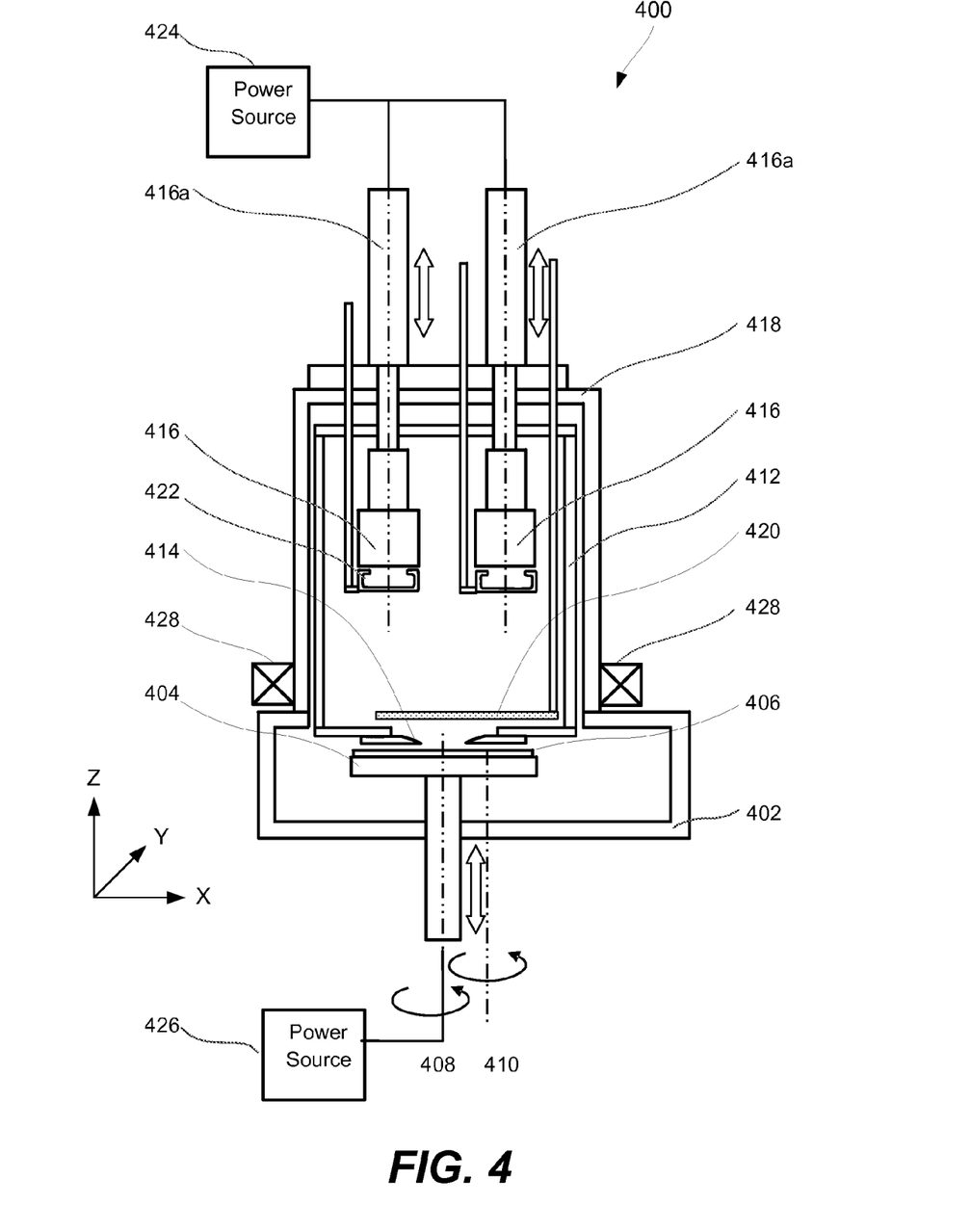
FIG. 4 illustrates a schematic diagram of a processing apparatus for performing combinatorial processing as well as full substrate processing, in accordance with some embodiments.

FIG. 4 is a schematic representation of a processing apparatus 400 for performing combinatorial and other types of processes, in accordance with certain embodiments. Processing apparatus 400 includes a bottom portion 402 disposed under a top portion 418. Bottom portion 402 may house a substrate support 404 for supporting a substrate 406. Various examples of substrates are described above with reference to FIG. 1A. Substrate support 404 may include a mechanism for maintaining position of substrate 406 during substrate processing and/or moving substrate support 404, e.g., during substrate alignment with respect to other components of apparatus 400. Some examples of such mechanisms include vacuum chucks, electrostatic chucks, mechanical clamps, and the like. Substrate support 404 may be capable of both rotating around its own central axis 408, which is referred to as a "rotation" axis, and rotating around an exterior axis 410, which is referred to as a "revolution" axis. This dual rotation feature allows substrate support 404 to move within an X-Y plane and to expose different parts of substrate 406 during processing to form discrete site isolation regions. Mobility of a substrate relative to other components of the processing apparatus and multiple site isolation regions formed on the same substrate are central to combinatorial processing using site-isolated mechanisms. Other substrate supports and moving mechanisms, such as XY tables, can also be used for this propose. Substrate support 404 may also move in a vertical direction (i.e., in the Z direction identified in FIG. 4). Various drive mechanisms, such as magnetic drives, linear drives, worm screws, lead screws, differentially pumped rotary feed through drive, may be used to provide this vertical motion and/or horizontal motion.

In some embodiments, substrate support 404 may be equipped with a heating mechanism and/or cooling mechanism for maintaining predetermined substrate temperatures. Substrate support 404 may be coupled to a power source 426 that is configured to provide a bias power to substrate support 404 and to substrate 406. In some embodiments, power source 426 provides a radio frequency (RF) power output sufficient for metal ionization and improving step coverage when forming layers in vias and other high aspect ratio features. In some embodiments, the RF power supplied by power source 426 is pulsed and synchronized with power output of another power source 424.

Top portion 418 of processing apparatus 400 includes processing kit 412, which defines a confinement region over a radial portion of substrate 406. Processing kit 412 may be formed as a sleeve having a base, which may be integrated with a shield 414. Shield 414 may have an opening allowing one or more sputtering fluxes from one or more sputtering guns 416 of kit 412 to reach substrate 406. The generated plasma dislodges atoms from one or more sputtering targets provided in guns 416, and these sputtered atoms deposit as a layer on an exposed portion of substrate 406. This exposed portion may include previously deposited layers. In some embodiments, full wafer processing is achieved by optimizing a gun tilt angle and target-to-substrate distance. Overall, multiple sputtering guns 416 may be used for site specific or blanket layer deposition.

Processing kit 412 may be moved in and out of processing apparatus 400. That is processing kit 412 may be a replaceable insert. In some embodiments, process kit shield 412 has a cylindrical shape. Other shapes may be used as well. As explained above, the base of processing kit 412 includes shield 414 with an opening. This opening should be distinguished from other openings and apertures that may be used in this apparatus, such as an opening provided on a shutter 420. In some embodiments, components other than the shield may be used to provide openings and allow sputtered fluxes out of processing kit 412.

Shutter 420 of processing kit 412 is movable with respect to shield 414 or, more specifically, with respect to the opening in shield 414. Shutter 420 may move between a closed position, in which shutter 420 overlaps and covers the opening of shield 414, and an open position, in which shutter 420 is kept clear from the opening of shield 414. Other intermediate positions, in which shutter 420 partially overlaps with and partially cover the opening of shield 414 may be used as well. The open and closed positions are further explained below with reference to FIGS. 5A and 5B.

In some embodiments, a shutter has multiple openings of different size. In this case, open and closed positions of the shutter may correspond to differently sized openings of shutter being aligned with the shield opening of shield. As such, this shutter may not be kept clear from the opening of shield even in its open position.

Shutter 420 may be provided inside processing kit 412 and may slide over an interior bottom surface of the base of processing kit 412 as shown in FIG. 4. In some embodiments, shutter 420 may be provided outside of processing kit 412 and may slide under an exterior bottom surface of the base or processing kit 412. Various drives and controllers may be used to actuate shutter 420 and move it into a desired position. Even though a shutter 420 is illustrated in FIG. 4, a processing kit may include multiple shutters. Each shutter may include a differently sized opening.

In addition to shutter 420 for blocking the opening in the bottom of processing kit 412, each sputtering gun may include its own gun shutter 422. Gun shutter 422 functions to cover a corresponding sputtering gun when this gun is not used for deposition. For example, processing kit 412 may include two sputtering guns 416 as, for example illustrated in FIG. 4. When one sputtering gun is used for depositing one material, the other sputtering gun may be have its shutter covering the sputtering target to avoid contamination. In some embodiments, the shutter of the second gun may be fully or partially opened when the first gun is used for sputtering in order to provide co-deposition of multiple materials provided by two or more sputtering guns. As such, gun shutters may be used, to control composition of the deposited layer.

FIG. 4 illustrates two sputtering guns 416 provided as a part of processing kit 412. In general, any number of sputtering guns may be provided, e.g., one, two, three, or four. The number of sputtering guns depends on material needs and other test considerations. For example, deposition of a three-layered stack including a barrier layer, seed layer, and capping layer may use three sputtering guns (e.g., when materials of all three layers are different) or two sputtering guns (e.g., when some layers have the same materials). For example, one sputtering gun may include titanium and/or tantalum for depositing diffusion barrier and capping layers, while another sputtering gun may include copper for depositing a seed layer.

In some embodiments, one or more sputtering guns 416 are tilted with respect an axis that is normal to the semiconductor substrate. In some embodiments, the angle may be between about 5 degrees and 20 degrees. The angle depends on the target size, target-to-substrate spacing, target material, power, pressure, and other parameters.

Sputtering guns 416 may be moveable in a vertical direction (the Z direction) to adjust the distance between the sputtering targets provided in guns 416 and substrate 406. In some embodiments, this distance is between about 7 inches and 14 inches or, more specifically, between about 10 inches and 12 inches. In some embodiments, sputtering guns 416 may be removable from processing kit 412, while processing kit 412 remains as a part of apparatus 400. For example, a gun having a target containing one material may be replaced with another gun having a target containing a different material.

Gun arms 416a are used to support and/or move sputtering guns 416. Gun arms 416a may be attached to a suitable drive, such as a lead screw, worm gear, and the like. For example, gun arms 416a may be configured to move sputtering guns 416 in the vertical direction (the Z direction). Gun arms 416a may also be used to tilt sputtering guns 416 relative to the normal axis of the substrate. In some embodiments, sputtering guns 416 are tilted toward the openings provided over the substrate when performing combinatorial processing. Alternatively, sputtering guns 416 are tilted toward the shield aperture when performing combinatorial processing. In some embodiments, sputtering guns 416 are tilted toward a periphery of substrate 406 when performing deposition over the entire substrate surface. Tilting and vertical movements of one or more sputtering guns may be performed simultaneously or independently. In some embodiments, gun arms 416a allow movement within four degrees of freedom. The amount of tilting of the process guns may be dependent on the process being performed.

A power source 424 is used to provide power to sputtering guns 416. Power source 424 should be distinguished from power source 426, which is used to provide RF bias power to an electrostatic chuck. Output of power source 426 may be synchronized with the output of power source 424. Power source 424 may output a direct current (DC) power supply or a radio frequency (RF) power supply. In some embodiments, the DC power is pulsed and the duty cycle may be less than 30% on-time at maximum power. The peak power may be between about 10-15 kilowatts, but generally depends on the target size and other parameters. A peak power for high metal ionization and high density plasma may be achieved at a relatively low average power, which will not cause target overheating/cracking issues.

Examples of Different Shutter Positions

Figure 5A:
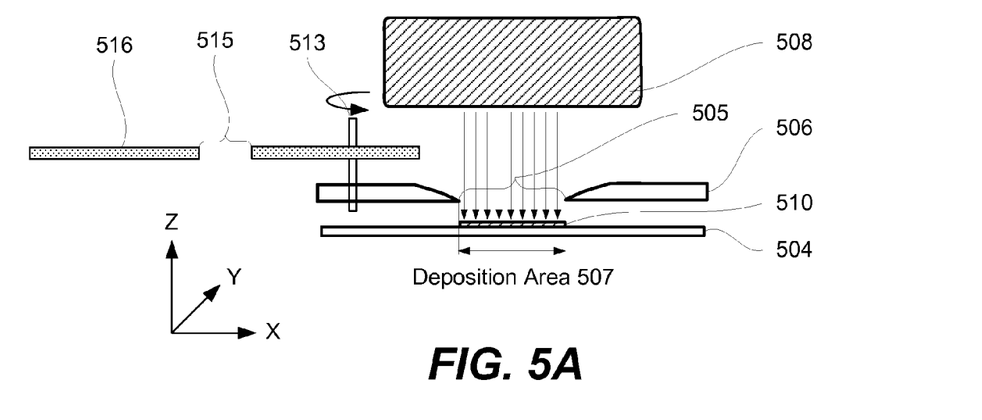
FIGS. 5A and 5B illustrate schematic cross-sectional representations of selected components of the processing apparatus having it shutter in open and closed positions, respectively, in accordance with some embodiments.
Figure 5B:
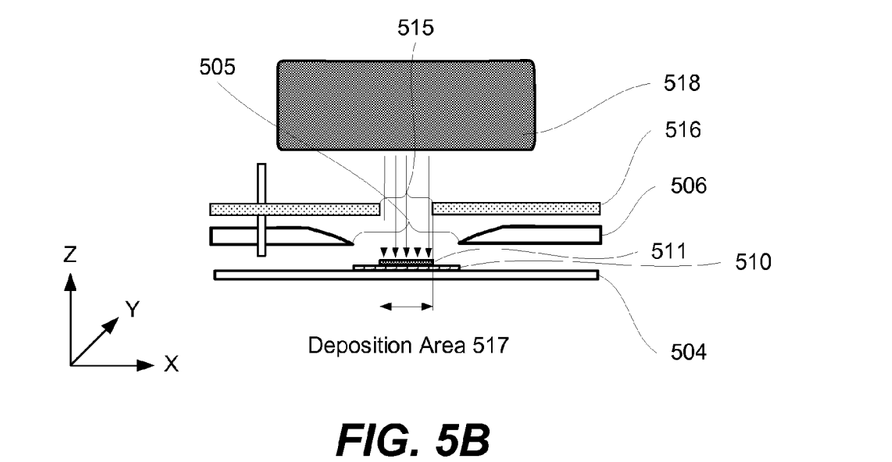

FIGS. 5A and 5B illustrate schematic representations of selected components of a processing apparatus reflecting open and closed positions of a shutter 516, in accordance with some embodiments. It should be noted that many other components of the processing apparatuses are not shown in these figures for clarity. FIG. 5A illustrates a sputtering gun 508 positioned over a substrate 504. A path for sputtered materials is controlled by first opening 505, which may be a part of component 506 of the processing apparatus. Component 506 may be a shield, shutter, mask, or any other suitable component, some of which are described above with reference to FIG. 4. First opening 505 defines a deposition area 507 of first layer 510. The relationship between dimensions of deposition area 507 and opening 505 may depend on relative orientations of the opening periphery and the top surface of substrate 504 (e.g., parallel or angled), vertical (in the Z direction) and horizontal (in the X-Y plane) orientations of sputtering gun 508 relative to opening 505 and substrate 504, tilting angles of sputtering gun 508, and other factors.

During deposition of layer 510, material flux generated by sputtering gun 508 is allowed through first opening 505 and is not restricted by shutter 516, at least in the example illustrated in FIG. 5A. Shutter 516 is shown in its open position and does not overlap with first opening 505 in this example. In some embodiments, some overlap between shutter 516 and opening 505 may happen even in this open position of the shutter. Furthermore, in some embodiments, both openings (a larger one and smaller one) are provided in the same shutter. In some embodiments, the shutter moves between two positions, in which either its larger opening or its smaller opening is positioned inbetween the substrate and sputtering gun and aligned with a specific site isolation region. When the larger opening is aligned with the site isolation region, this position of the shutter may be referred to as an open position. In a similar manner, when the smaller opening is aligned with the site isolation region, this position of the shutter may be referred to as a closed position in some embodiments. Overall, various hardware options may be utilized to provide two or more differently sized openings to control deposition areas. For example, a shutter with multiple positions may be used. One of these positions may correspond to an opening having a specific size, while another position may include no opening to completely block deposition from the target.

Shutter 516 may be moved between its open and closed positions by rotating shutter 516 with respect to supporting shaft 513. Other mechanisms for supporting and moving shutter 516 between its two positions may be used. In the closed position, shutter 516 is positioned between sputtering gun 518 and substrate 504 as, for example, shown in FIG. 5B. Shutter 516 may be positioned either below (not shown) or above (shown) component 506 having first opening 505.

Shutter 516 may include a second opening 515, which may be smaller than first opening 505. Second opening 515 defines deposition area 517 of second layer 511 by restricting the sputtered flux from sputtering gun 518. In some embodiments, different sputtering guns may be used to form layers having different compositions, e.g., a barrier layer and a seed layer. To provide alignment between first layer 510 and second layer 511 or, more specifically, between first deposition area 507 and second deposition area 517, shutter 516 is aligned relative to component 506. As a result of this alignment, opening 515 is aligned with opening 505. Position of substrate 504 relative to component 506 may not change when shutter 516 is moved between its open position (illustrated in FIG. 5A) and closed position (illustrated in FIG. 5B). In some embodiments, substrate 504 may move into a different position relative to opening 505 or, vice versa, opening 505 (or, more specifically, component 506) may be moved away relative to substrate 504 and the targeted site isolation region. In some embodiments, component 506 may be moved away from the sputtering flux path such that sputtered materials only passes through opening 515 of shutter 516 and not through opening 505 of component 506, which may be positioned away from the deposition area. For example, two shutters may be used interchangeably. One shutter may have a first opening to control the sputtered flux. Another shutter may have a second, differently sized opening to control the sputtered flux. Before introducing the second shutter into the path of the sputtered flux, the first shutter is removed. Alternately, a larger size opening may stay in series with a smaller size opening.

Returning to the example illustrated in FIG. 5B, opening 515 may be aligned with opening 505. In some embodiments, opening 515 may have the same profile as opening 505. For example, both openings may be circular, oval, rectangular, or have some other suitable shape. Openings 515 and 505 may be concentric or, more specifically, aligned to provide concentric deposition areas 507 and 517. For example, when openings 515 and 505 are spaced apart in the vertical direction (the Z axis) and when the sputtered flux arrives at an angle other than the normal relative to the top surface of substrate 504, then non-concentric alignment of openings 515 and 505 may be needed to achieve concentric alignment of deposition areas 507 and 517. Generally, second smaller opening 515 is positioned within the boundary of the first opening 505 based on the vertical projection (the Z direction, normal to the top surface of substrate).

As stated above, first opening 505 is larger than second openings 515. In some embodiments, the first opening 505 is between about 1.2 and 5 times larger than the second opening 515 or, more specifically, between about 1.5 and 3 times larger. For purposes of this document, a "cross-section dimension" is defined as a largest dimension of the shape, e.g., a diameter of a circle or a diagonal of a rectangle. In some embodiments, a diameter of the larger opening is between about 30 mm and 120 mm or, more specifically, between about 50 mm and 70 mm, while the smaller opening has a diameter of between 15 mm and 60 mm or, more specifically, between 20 mm and 40 mm. Such openings may be used on a substrate that is a 200-mm wafer or 300-mm wafer. Selection of these dimensions may be driven by a desired number of samples on the same substrate and size of each sample or, more specifically, deposition areas of layers in each sample portion. In some embodiments, a diameter/area of the first opening is between about 2 and 10 times less than a diameter/area of the substrate or, more specifically, between about 4 and 6 times less.

Processing Examples

Figure 6:
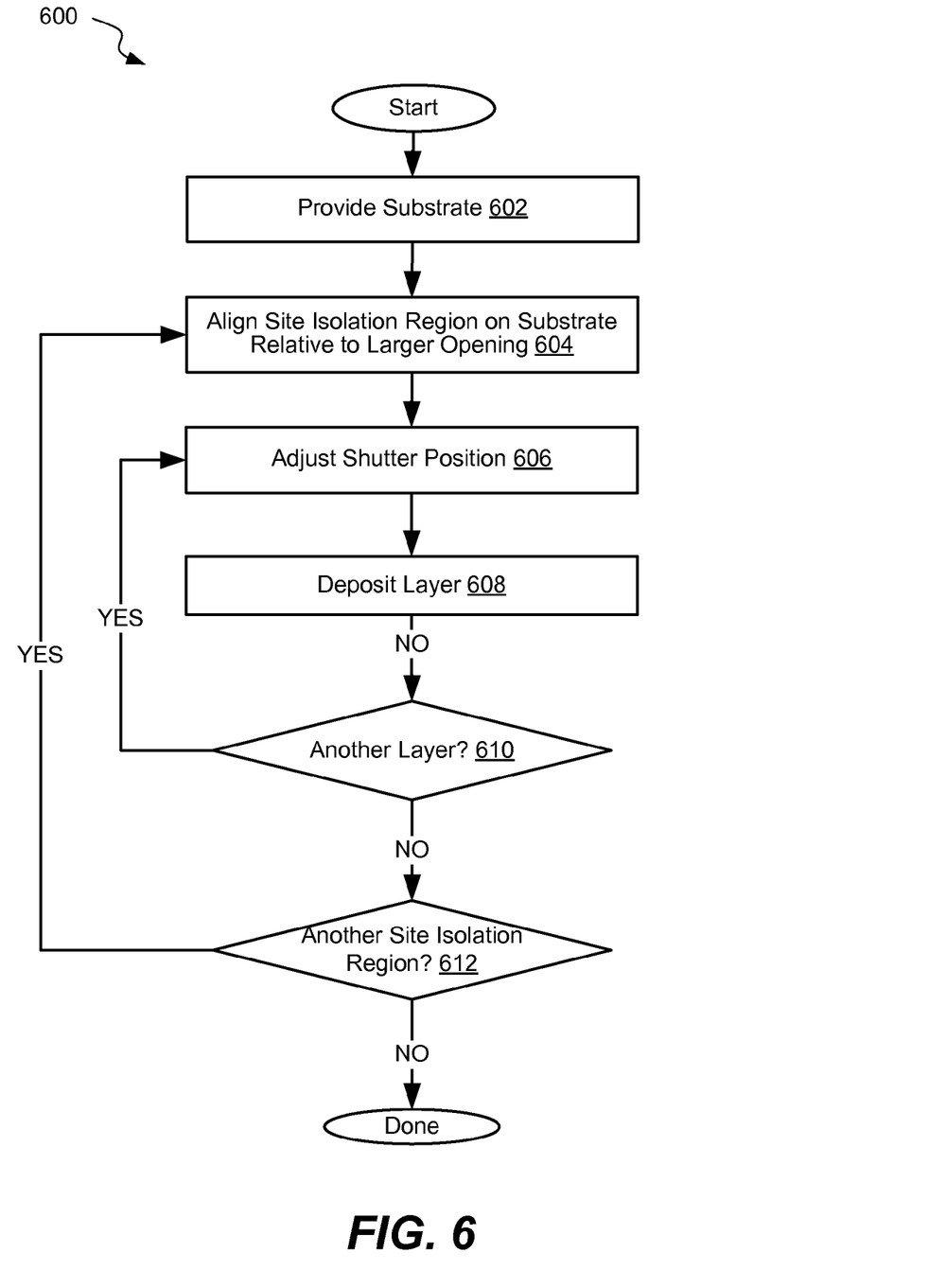
FIG. 6 illustrates a process flowchart corresponding to a method of forming a multilayered structure at a site isolation region of a semiconductor substrate, in accordance with some embodiments.

FIG. 6 illustrates a process flowchart corresponding to a method 600 for forming one or more multilayered structures at one or more site isolation regions of a semiconductor substrate, in accordance with some embodiments. Method 600 may commence with providing the semiconductor substrate during operation 602. Various examples of semiconductor substrates are described above with reference to FIG. 1A. In general, a substrate may be sufficiently large to provide multiple site isolation regions for multilayered structures. The substrate may be position on a substrate support of a processing apparatus for providing heat transfer and/or bias to substrate.

Method 600 may proceed with aligning a site isolation region on the semiconductor substrate with a larger opening of the processing apparatus during operation 604. The site isolation region may already have one or more layers deposited on a top surface of the substrate. Alternatively, no layers may be deposited and the site isolation region may include an exposed top surface of the substrate. It should be noted that the substrate may include other site isolation regions that may or may not have layers deposited in these other regions already.

Operation 604 may include moving the substrate (by moving the substrate support) in the horizontal plane, which may be parallel to the top surface of the substrate and/or parallel to the larger opening. This may be accomplished by, for example, rotating the substrate support with respect to one or more its axes, as described above with reference to FIG. 4. Generally, the top surface of the substrate remains parallel to edges of the opening during this alignment operation.

Operation 604 may also involve vertical alignment of the substrate relative to the opening, e.g., by moving the substrate in the vertical direction. Furthermore, operation 604 may involve various alignments of a sputtering gun relative to the larger opening or relative to the substrate. For example, the sputtering gun may be horizontally and/or vertically aligned relative to the substrate in manners similar to substrate alignment described above. The sputtering gun may be tilted with respect to the horizontal plane, which may be defined by the top surface of the substrate. These alignment options may influence a deposition area in addition to the control provided by the larger opening itself.

It should be noted that this alignment operation may be repeated one or more times to perform deposition at different site isolation regions on the same substrate. Moving from a first region to a second may be performed after completing deposition of all layers at the first region or after depositing only one layer at the first site and later returning to this site to deposit one or more additional layers. In some embodiments, alignment of a site isolation region with the larger opening is maintained throughout a number of different operations and alignment operation 604 may not be performed in every cycle provided by decision block 612 as shown in FIG. 6.

When the site isolation region is aligned with the larger opening, method 600 may proceed with adjusting positing of the shutter, if necessary, during operation 606. It may be determined that the shutter is already in the correct position and method 600 may proceed directly to operation 608 after completing operation 604. Alternatively, it may be determined that the shutter may need to be moved into a different position. The position of the shutter is determined based on a required deposition area of the layer to be deposited in the next operation. As explained above with reference to FIGS. 5A and 5B, if a larger deposition area is needed, then the shutter is moved to or kept in the open position. On the other hand, if the smaller deposition area is needed, then the shutter is moved or kept in the closed position. It should be noted that alignment operation 604 and shutter adjustment operation 606 may be performed in any order.

Once the site isolation region is aligned relative to the larger opening and the shutter is in the proper position, method 600 may proceed with depositing a layer having a deposition area determined by the position of the shutter and size of the smaller or larger opening during operation 608. An inert gas (e.g., argon) may be introduced into a chamber of the processing apparatus and plasma may be ignited by applying a DC power to the sputtering target. In some embodiments, the resulting plasma is confined using a magnetic field in the proximity of the target. During deposition, the argon is positively ionized in the plasma to form argon ions, which impinge on a negatively charged target with a sufficient momentum to dislodge metal atoms from the target. The neutral metal atoms dislodged from the target can be further ionized in the plasma. The metal species including neutral and ionized metal atoms are being sputtered from the target onto the wafer and deposit on the wafer surface forming a diffusion barrier layer. For example, a two-inch sputter target (also referred to as a sputter source) can be used. In some embodiments, the target size can range from 1-4" depending on the number of sputter guns in the process chamber. Processing pressures in the chamber can range from 1-10 mTorr or, more specifically, from 2-4 mTorr. The deposition power (for a two-inch gun) can be on the order of 100-400 W, but in the case of co-sputtering, the deposition power for the minority component (or components) can be on the order of 20-30 W. The maximum power depends on the gun size (power density), type (direct or indirect cooled) and target material (brittleness and thermal conductivity). Minimum power may be limited by the power supply used.

As noted above, a layer may be deposited on the top surface of the substrate or over one or more previously formed layers. For example, a barrier layer containing tantalum and/or titanium may be deposited onto the substrate. A seed layer containing copper may be deposited over the barrier layer. A capping layer containing tantalum and/or titanium may be deposited over the copper seed layer to protect it from oxidation when the substrate is exposed to the ambient. Test stacks may includes layers of substrate covered with a bottom barrier, then seed layer, then top barrier, where the top barrier material is also used as a cap. Barrier materials can be bilayer (e.g., TaN/Ta) where one material serves as the primary barrier (e.g., TaN) and the other material serves to improve Cu wetting/adhesion and promote good electrical reliability (e.g., electromigration and stress migration) or a single barrier material that is able to serve both purposes. Example barrier materials include, TaN/Ta, $Ta_xTi_y$, $Ta_xMe_y$ (where Me represents another metal of interest), TiN/Ti, $Ti_xAl_yN$, $Ta_xAl_yN$, $Ti_xSi_yN$, $Ta_xSi_yN$, and others.

The alignment of the site isolation region with respect to the larger opening and, in some embodiments, with respect to the smaller opening in the shutter ensures alignment between deposition areas of different layers. In the above example, the barrier layer may be deposited with an open shutter resulting in the larger deposition area. A shutter may be then closed during deposition of the copper seed layer resulting in the smaller deposition area of copper layer and ensuring that this smaller deposition area of the copper layer is positioned within the larger deposition area of the barrier material at a given site isolated region. Concentric alignment of the larger and smaller openings may ensure a border provided around smaller deposition areas.

Multiple layers may be deposited at the same site isolated region as reflected by decision block 610. In some embodiments, two or more sequentially deposited layers are deposited in situ, i.e., without removing the substrate from the chamber, in more specific embodiments without breaking the vacuum in the chamber. This may involve repeating operations 606 and 608. Depending on compositions of the layers, deposition of different layers may be performed using different sputtering guns or, more specifically, different sputtering targets. Various materials for corresponding layers are described elsewhere Depending on deposition area requirements, a shutter may be moved into different positions if necessary. For example, an initial layer deposited onto the substrate may be a barrier layer and this layer needs to have a larger deposition area. As such, sputtering of the barrier layer may be performed with the shutter in the open position. The next layer deposited over the barrier layer may be a seed layer, and it needs to have a smaller deposition area. In this case, the shutter may be closed, and deposition of the copper layer is then performed with the shutter in the closed position (through an opening in the shutter). The process may then proceed with deposition of the capping layer having a larger deposition area, and the shutter is then opened again. In some embodiments, two adjacent layers may be deposited with the same deposition area and operation 606 is skipped.

As explained above, all layers of a multilayered structure positioned at a site isolation region may be formed before moving to another site isolation region. In other words, an inner cycle defined by block 610 and including operations 606 and 608 may be repeated at least once while maintaining the initial alignment provided during operation 604. A number of these inner cycles may depend on the number of layers in a multilayered structure. Method 600 may then proceed with outer cycle defined by decision block 612. This outer cycle involves aligning the larger opening with respect to another site isolation site during operation 604 and then performing operations corresponding to one or more inner cycles.

In some embodiments, one or more layers may be deposited at a first site isolation region. The method may proceed with deposition at one or more different site isolation regions and then returning back to the first site isolation region to deposit one or more additional layers. Overall, any combination of inner and outer cycles may be implemented during method 600.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of forming multilayered structures on substrates, the method comprising:
   providing a processing apparatus comprising a first opening and a second opening, the second opening provided on a shutter, the second opening being smaller than the first opening;
   providing a substrate comprising a first site isolation region;
   aligning the first site isolation region relative to the first opening;
   forming a first layer on the substrate, wherein forming the first layer comprises sputtering a first material through the first opening and wherein forming the first layer defines a first deposition area of the first layer;
   adjusting position of the shutter such that the second opening is positioned within a boundary of the first opening; and
   forming a second layer on the first layer, wherein forming the second layer comprises sputtering a second material through the second opening, wherein forming the second layer defines a second deposition area of the second layer, and wherein the second deposition area is within a boundary of the second deposition area.

2. The method of claim 1, wherein an area of the first opening is between 1.2 and 5 times larger than an area of the second opening.

3. The method of claim 1, wherein the first opening and the second opening have the same shape.

4. The method of claim 3, wherein the first opening and the second opening have circular shapes.

5. The method of claim 3, wherein the first opening and the second opening are concentric when the second opening is positioned within the boundary of the first opening.

6. The method of claim 1, wherein an area of the first opening is between 2 and 10 times less than an area of the substrate.

7. The method of claim 1, wherein the first layer comprises a diffusion barrier material and the second layer comprises copper.

8. The method of claim 7, wherein the diffusion barrier material comprises one or more of tantalum and titanium.

9. The method of claim 1, wherein the substrate comprises one or more of silicon, silicon dioxide, aluminum oxide, sapphire, germanium, gallium arsenide, an alloy of silicon and germanium, indium phosphide.

10. The method of claim 1, further comprising adjusting a position of the shutter such that the shutter is clear of the first opening and forming a third layer on the substrate through the first opening, wherein forming the third layer defines a third deposition area of the third layer and wherein the third deposition area is aligned with the first deposition area.

11. The method of claim 10, wherein the third layer comprises a capping material.

12. The method of claim 11, wherein the capping material comprises one or more of tantalum and titanium.

13. The method of claim 1, wherein forming the first and second layers is performed in situ.

14. The method of claim 1, wherein depositing at least one of the first and second layers is performed using a sputtering gun tilted at an angle with respect to an axis normal to the substrate.

15. The method of claim 14, wherein the angle is between about 5 degrees and 20 degrees.

16. The method of claim 1, wherein depositing the first layer is performed using a first sputtering gun and depositing the second layer is performed using a second sputtering gun.

17. The method of claim 1, wherein the substrate is movable with respect to the first opening in a direction parallel to a top surface of the substrate.

18. The method of claim 1, further comprising aligning a second site isolation region on the substrate with the first opening of the processing apparatus and repeating deposition of the first layer, adjusting the position of the shutter, and depositing the second layer.

19. A method of forming multilayered structure on substrates, the method comprising:
    providing a processing apparatus comprising a first opening and a second opening, the second opening provided on a shutter, the second opening being smaller than the first opening;
    providing a substrate comprising a first site isolation region;
    aligning the first site isolation region relative to the first opening;
    forming a first layer on the substrate, wherein forming the first layer comprises sputtering a first material through the first opening and wherein forming the first layer defines a first deposition area of the first layer;
    adjusting position of the shutter such that the second opening is positioned within a boundary of the first opening; and
    forming a second layer on the first layer, wherein forming the second layer comprises sputtering a second material through the second opening, wherein forming the second layer defines a second deposition area of the second layer, and wherein the second deposition area is within a boundary of the second deposition area;
    adjusting the position of the shutter such that the shutter is clear from the boundary of the first opening; and
    forming a third layer on the semiconductor substrate, wherein forming the third layer comprises sputtering a third material through the first opening, wherein forming the third layer defines a third deposition area of the third layer, and wherein the third deposition area is aligned with the first deposition area,
    wherein the second layer is positioned in between the first layer and the second layer.

* * * * *